US 6,737,705 B2

(12) United States Patent
Momota et al.

(10) Patent No.: US 6,737,705 B2
(45) Date of Patent: May 18, 2004

(54) INSULATED GATE SEMICONDUCTOR DEVICE

(75) Inventors: Seiji Momota, Nagano (JP); Yuichi Onozawa, Nagano (JP); Masahito Otsuki, Nagano (JP); Hiroki Wakimoto, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/843,251

(22) Filed: Apr. 26, 2001

(65) Prior Publication Data
US 2001/0054738 A1 Dec. 27, 2001

(30) Foreign Application Priority Data

Apr. 26, 2000 (JP) .......................... 2000-126016

(51) Int. Cl.[7] .................. H01L 29/745; H01L 29/78
(52) U.S. Cl. ................. 257/330; 257/331; 257/139; 257/341; 257/152
(58) Field of Search ................ 257/330–332, 257/368, 571, 586, 588, 622, 139, 341, 152

(56) References Cited

U.S. PATENT DOCUMENTS 6,111,290 A * 8/2000 Uenishi et al. ............ 257/331
6,114,727 A * 9/2000 Ogura et al. ............. 257/342

FOREIGN PATENT DOCUMENTS

JP 5-243561 9/1993

* cited by examiner

Primary Examiner—Jerome Jackson
Assistant Examiner—Jose R. Diaz
(74) Attorney, Agent, or Firm—Rossi & Associates

(57) ABSTRACT

A trench-type IGBT includes a silicon substrate, a lightly doped n-type drift layer on the silicon substrate, and a p-type base layer on the n-type drift layer. The p-type base layer is doped more heavily than the n-type drift layer, and is formed of first regions and second regions. $N^+$-type source regions are formed selectively in the surface portions of the first regions of p-type base layer. Trenches are dug from the surfaces of $n^+$-type source regions down to the n-type drift layer through the p-type base layer. A gate oxide film covers the inner surface of each trench. Gate electrodes are provided in the trenches, wherein the gate electrodes face the p-type base layer via respective gate oxide films. An emitter electrode is in direct contact with the first regions of p-type base layer and $n^+$-type source regions. A collector electrode is provided on the back surface of silicon substrate. The ratio of the width of the first regions to the width of the second regions of p-type base layer is from 1:2 to 1:7. The device facilitates in reducing the total losses by reducing the switching loss while suppressing the on-voltage thereof as low as the on-voltage of the IEGT.

5 Claims, 4 Drawing Sheets

INSULATED GATE SEMICONDUCTOR DEVICE

FIELD OF THE INVENTION

The present invention relates to insulated gate semiconductor devices such as insulated gate bipolar transistors (hereinafter referred to as "IGBT's").

BACKGROUND

To reduce the electric power consumption of the electric power conversion apparatuses, it is necessary to reduce the electric power consumption of the semiconductor power devices, which are the main constituent elements of the electric power conversion apparatuses. Among the semiconductor power devices, IGBT's have been widely used since the IGBT's facilitate realizing low on-resistance by conductivity modulation and are easily driven by controlling the gate potential thereof. The IGBT's may be classified into a planar IGBT and a trench-type IGBT. The planar IGBT includes gate electrodes on the semiconductor chip surface. The trench-type IGBT includes trenches dug from the semiconductor chip surface and gate electrodes buried in the trenches. Since channels are formed on both sides of each trench, the channel density in the trench-type IGBT is high. The trench-type IGBT has been used more widely than the planar IGBT, since the trench-type IGBT facilitates in further reducing the on-resistance due to the high channel density thereof.

FIG. 9 is a cross sectional view of a conventional trench-type and n-channel IGBT perpendicular to the extending direction of the trench gates thereof. Referring now to FIG. 9, the conventional trench-type and n-channel IGBT includes a heavily doped p-type silicon substrate 1; a lightly doped n-type drift layer 2 on silicon substrate 1; a p-type base layer 3 on n-type drift layer 2; and $n^+$-type source regions 4 formed selectively in the surface portion of p-type base layer 3. Trenches are formed from the surfaces of $n^+$-type source regions 4 down to n-type drift layer 2 through p-type base layer 3. A polycrystalline silicon gate electrode 6, working as a control electrode, is buried in each trench with a gate oxide film 5 interposed therebetween. An interlayer insulation film 7 is on gate electrode 6 such that interlayer insulation film 7 covers the upper end of gate electrode 6. An emitter electrode 8 on interlayer insulation films 7 contacts commonly with p-type base layer 3 and $n^+$-type source regions 4. Although not illustrated in FIG. 9, a passivation film such as a silicon nitride film or an amorphous silicon film is sometimes on emitter electrode 8. A collector electrode 9 is on the back surface of p-type silicon substrate 1.

Now the operation for bringing the conventional trench-type and n-channel IGBT into the ON-state thereof will be explained below. Usually, emitter electrode 8 is connected to the ground. The IGBT is in the OFF-state thereof when the voltage applied to collector electrode 9 is higher than the ground potential and the voltage applied to gate electrodes 6 is lower than the threshold value. When a voltage higher than the threshold value is applied to gate electrodes 6, a gate drive circuit 10 starts accumulating electric charges on gate electrodes 6 via gate resistance 11. At the same time, the portions of p-type base layer 3 facing to gate electrodes 6 through respective gate oxide films 5 are inverted to n-type, resulting in channel portions. Electrons are injected from emitter electrode 8 into n-type drift layer 2 via $n^+$-type source regions 4 and the resulting channel portions in p-type base layer 3. Since the injected electrons apply a forward bias voltage between p-type silicon substrate 1 and n-type drift layer 2, holes are injected from collector electrode 9. The voltage drop caused between emitter electrode 8 and collector electrode 9 at this moment is the on-state voltage drop of the IGBT.

By lowering the voltage between emitter electrode 8 and gate electrodes 6 below the threshold value, the IGBT is brought into an OFF-state from the ON-state thereof. As the voltage between emitter electrode 8 and gate electrodes 6 is lowered below the threshold value, the electric charges accumulated on gate electrodes 6 are discharged to gate drive circuit 10 via gate resistance 11. In association with the discharge, the channel portions, which have been converted to n-type, return to p-type. Since there are no channels left any longer, neither electrons nor holes are injected any more. The accumulated electrons are swept out to collector electrode 9. The accumulated holes are swept out to emitter electrode 8. Or, the excess electrons and holes recombine to vanish. As a result, the IGBT is brought into the OFF-state thereof.

Various improvements have been proposed to further reduce the on-voltage of the IGBT's. Japanese Unexamined Laid Open Patent Application H05-243561 discloses an injection enhanced gate bipolar transistor (hereinafter referred to as an "IEGT"), that exhibits an on-voltage as low as the on-voltage of the diode. In the IEGT, some $n^+$-type source regions and some regions of the p-type base layer are covered with an insulation film so that these regions may not contact with the emitter electrode. Although the IEGT works basically in the same way as the trench-type IGBT, the holes below the regions of the p-type base layer, including the $n^+$-type source regions, which are not in direct contact with the emitter electrode, are hardly swept out to the emitter electrode. Since the holes, not swept out to the emitter electrode, are accumulated, the distribution of the carriers below the regions of the p-type base layer not in direct contact with the emitter electrode is close to that in the diode. As a result, the on-voltage of the IEGT is lower than the on-voltage of the conventional trench-type IGBT. However, it is required for the semiconductor power devices to exhibit high-speed switching characteristics in addition to a low on-voltage. Therefore, it is also important to improve the switching characteristics of the trench-type IGBT.

Since the trench-type IGBT and the IEGT include trenches formed at a high density as described above, large capacitance is caused between the gate electrodes and the emitter electrode thereof. As described in connection with the operations of the IGBT, it is necessary to electrify or discharge the above-described capacitance during the transition from the OFF-state to the ON-state or vice versa. When the capacitance is large, the time for electrifying or discharging is prolonged. This delay for electrifying or discharging further causes an increase in loss. The losses caused in the semiconductor power device are the sum of the steady state loss determined by the on-voltage and the switching loss caused by the turn-on and turn-off of the device. Therefore, it is important to reduce the switching loss; that is, to reduce the capacitance between the gate electrodes and the emitter electrode.

In view of the foregoing, it would be desirable to provide a trench-type IGBT, that obviates the problems described above. It would further be desirable to provide a trench-type IGBT that facilitates reducing the total losses by lowering the switching loss while suppressing the on-voltage thereof as low as the on-voltage of the IEGT.

SUMMARY OF THE INVENTION

According to an aspect of the invention, there is provided an insulated gate semiconductor device including: a first semiconductor layer of a first conductivity type having a first major surface and a second major surface; a lightly doped second semiconductor layer of a second conductivity type on the first major surface of the first semiconductor layer; a third semiconductor layer of the first conductivity type on the second semiconductor layer, the third semiconductor layer being doped more heavily than the second semiconductor layer, the third semiconductor layer being formed of first regions and second regions arranged alternately; fourth semiconductor layers of the second conductivity type formed selectively in the surface portions of the first regions of the third semiconductor layer; trenches formed from the surfaces of the fourth semiconductor layers down to the second semiconductor layer through the third semiconductor layer; insulation films covering the inner surfaces of the trenches; control electrodes in the trenches, the control electrodes facing to the third layer through the respective insulation films; a first main electrode in direct contact with the first regions of the third semiconductor layer and the fourth semiconductor layers, the first main electrode being not in direct contact with the second regions of the third semiconductor layer; a second main electrode on the second major surface of the first semiconductor layer; and the ratio of the width of the first regions of the third semiconductor layer to the width of the second regions of the third semiconductor layer being from 1:2 to 1:7. The semiconductor structure described above facilitates reducing the total losses of the trench-type IGBT by reducing the switching loss while suppressing the on-voltage thereof as low as the on-voltage of the IEGT.

According to another aspect of the invention, there is provided an insulated gate semiconductor device including: a first semiconductor layer of a first conductivity type having a first major surface and a second major surface; a lightly doped second semiconductor layer of a second conductivity type on the first major surface of the first semiconductor layer; a third semiconductor layer of the first conductivity type on the second semiconductor layer; fourth semiconductor layers of the second conductivity type formed selectively in the surface portions of the third semiconductor layer; first trenches formed from the surfaces of the fourth semiconductor layers through the third semiconductor layer; second trenches formed through the third semiconductor layer; insulation films covering the inner surfaces of the first trenches and the second trenches; a first main electrode in direct contact with the third semiconductor layer and the fourth semiconductor layers; a second main electrode on the second major surface of the first semiconductor layer; control electrodes in the respective first trenches, each of the control electrodes facing to the third semiconductor layer with an insulation film interposed therebetween, the control electrodes being not connected electrically to the first main electrode; and electrodes in the respective second trenches, each of the electrodes facing to the third semiconductor layer with an insulation film interposed therebetween, the electrodes being connected electrically to the first main electrode. The semiconductor structure described above also facilitates reducing the total losses of the trench-type IGBT by reducing the switching loss while suppressing the on-voltage thereof as low as the on-voltage of the IEGT.

Advantageously, the second regions of the third semiconductor layer are connected electrically to the first main electrode via high resistance. This modification facilitates preventing the blocking voltage from lowering.

BRIEF DESCRIPTION OF THE DRAWINGS

The invention will be described with reference to the following detailed description of the preferred embodiments and the accompanying drawings, wherein.

DETAILED DESCRIPTION OF THE PREFERRED EMBODIMENTS OF THE INVENTION

First Embodiment

Figure 1:
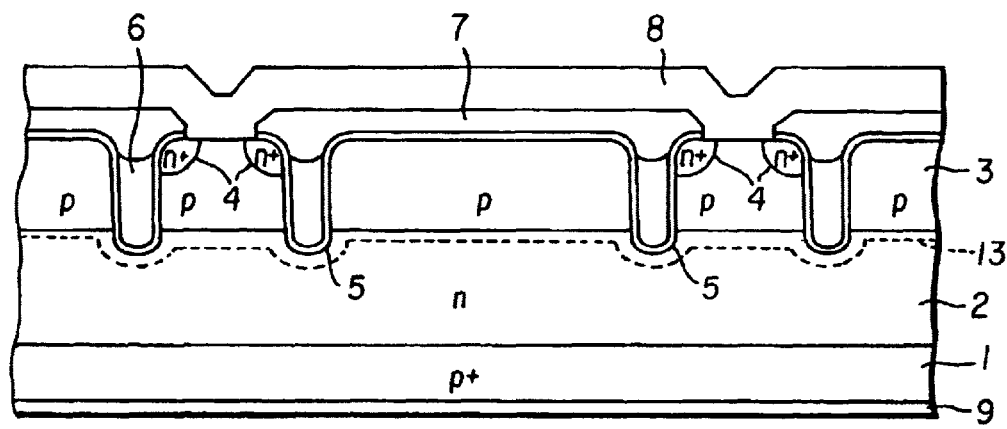
FIG. 1 is a cross sectional view of a trench-type IGBT according to the first embodiment of the invention.

FIG. 1 is a cross sectional view of a trench-type IGBT according to a first embodiment of the invention. FIG. 1 is the cross section perpendicular to the extending direction of the trench gates. Referring now to FIG. 1, the IGBT according to the first embodiment includes a p-type silicon substrate 1 having a first major surface and a second major surface; a lightly doped n-type drift layer 2 on the first major surface of silicon substrate 1; a p-type base layer 3 on n-type drift layer 2, p-type base layer 3 being doped more heavily than n-type drift layer 2, p-type base layer 3 being formed of first regions and second regions arranged alternately; $n^+$-type source regions 4 formed selectively in the surface portions of the first regions of p-type base layer 3; trenches dug from the surfaces of $n^+$-type source regions 4 down to n-type drift layer 2 through p-type base layer 3; a gate oxide film 5 arranged inside each of the trenches; gate electrodes 6 in the respective trenches, each gate electrode 6 facing to p-type base layer 3 via gate oxide film 5, gate electrodes 6 working as control electrodes; an interlayer insulation film 7 on the second region of p-type base layer 3; an emitter electrode 8 in direct contact with the first regions of p-type base layer 3 and $n^+$-type source regions 4, emitter electrode 8 being not in direct contact with the second regions of p-type base layer 3; and a collector electrode 9 on the second major surface of silicon substrate 1.

Figure 2:
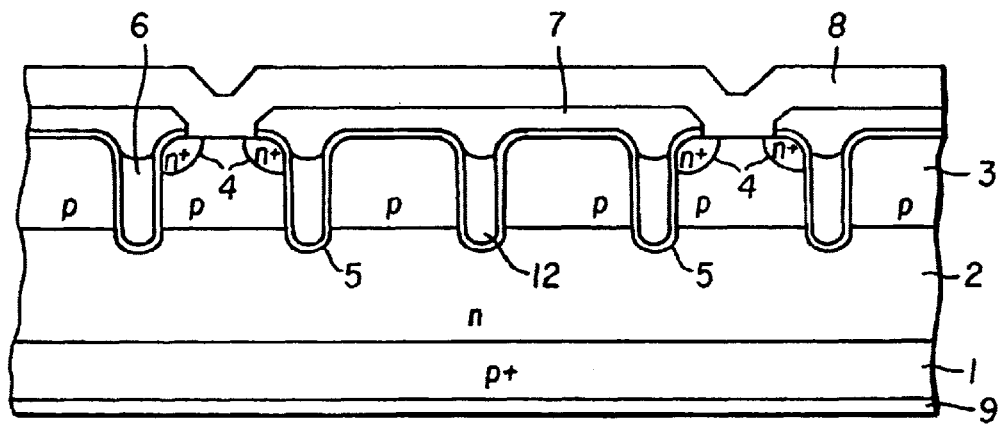
FIG. 2 is a cross sectional view illustrating an IEGT structure.

FIG. 2 is a cross sectional view illustrating an IEGT structure. Referring now to FIG. 2, the IEGT includes first cells, $n^+$-type source regions 4 and p-type base layer 3 thereof are in direct contact with emitter electrode 8, and second cells, $n^+$-type source regions 4 and p-type base layer 3 thereof are insulated from emitter electrode 8 by interlayer insulation film 7. In FIG. 2, the ratio of the first cells to the second cells is 1:2. The polycrystalline silicon layer, that does not work as a control electrode is designated by the reference numeral 12.

Figure 3:
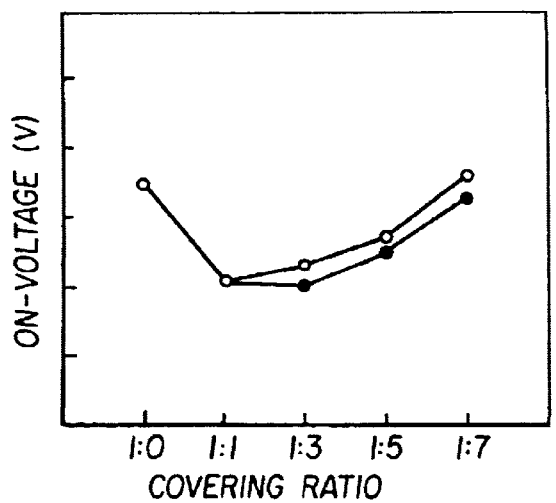
FIG. 3 is a pair of curves relating the on-voltage with the covering ratio of the width of the first regions of the p-type base layer, including the $n^+$-type source regions and in direct contact with the emitter electrode, to the width of the second regions of the p-type base layer, covered with the interlayer insulation film and not in direct contact with the emitter electrode, for the conventional IEGT and the IGBT according to the first embodiment of the invention.

FIG. 3 is a pair of curves relating the on-voltage with the ratio of the width of the first region of p-type base layer 3, including n+-type source regions 4 and in direct contact with emitter electrode 8, to the width of the second region of p-type base layer 3, covered with interlayer insulation film 7 and not in direct contact with emitter electrode 8. In other words, FIG. 3 relates the change of the on-voltage with the change of the ratio of the cells covered with interlayer insulation film 7. Hereinafter, the ratio of the width of the first regions to the width of the second regions or the ratio of the cells covered with interlayer insulation film 7 will be referred to simply as the "covering ratio". The solid circles in FIG. 3 are for the conventional IEGT of FIG. 2. As described in FIG. 3, the on-voltage lowers as the covering ratio increases from 1:0, indicating the accumulation of holes below interlayer insulation film 7 due to the IEGT effect. However, as the covering ratio further increases, the on-voltage again increases. Since the channel density lowers as the covering ratio increases, the resistance increases corresponding to the channel density lowering. As the covering ratio further increases, the on-voltage increase due to the increased resistance dominates over the on-voltage lowering due to the IEGT effect. In total, the on-voltage increases. Therefore, there exits an optimum value for the covering ratio.

Figure 5:
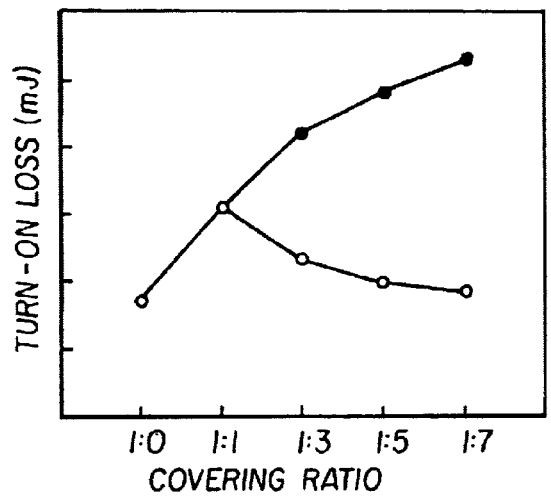
FIG. 5 is a pair of curves relating the turn-on loss with the covering ratio for the conventional IEGT and the IGBT according to the first embodiment of the invention.

FIG. 5 is a pair of curves relating the turn-on loss with the covering ratio. The solid circles in FIG. 5 are for the conventional IEGT of FIG. 2. As described in FIG. 5, the turn-on loss increases as the covering ratio increases. The number of the control electrodes is unchanged even when the covering ratio is increased. The amount of holes accumulated in the n-type drift layer is enough to obtain the IEGT effect increases. Since it is necessary to electrify the capacitance between the control electrodes and the emitter electrode and since it takes time to inject enough holes, the turn-on loss increases with increasing the covering ratio.

Figure 4:
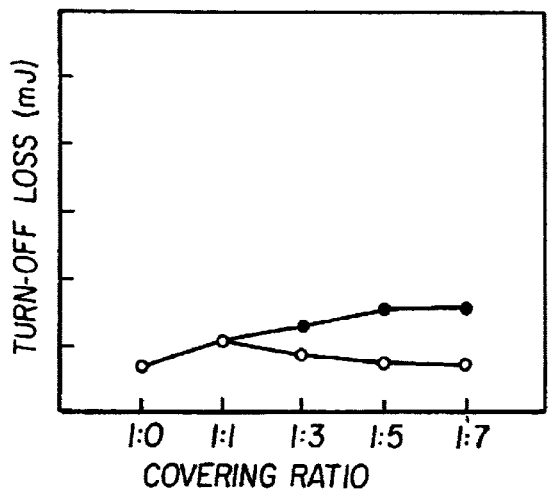
FIG. 4 is a pair of curves relating the turnoff loss with the covering ratio for the conventional IEGT and the IGBT according to the first embodiment of the invention.

FIG. 4 is a pair of curves relating the turnoff loss with the covering ratio. The solid circles in FIG. 4 are for the conventional IEGT of FIG. 2. The results described in FIG. 4 are essentially the same with those described in FIG. 5. Therefore, it is necessary to determine an optimum covering ratio considering the on-voltage, the turn-on loss and the turnoff loss.

Since the IGBT according to the first embodiment does not include any polycrystalline silicon layer 12 that does not work as a control electrode, the times for electrifying and for discharging are shortened. These effects are described in FIGS. 5 and 4 with the open circles. As described in FIGS. 4 and 5, the losses in the IGBT according to the first embodiment are lower than those of the conventional IEGT. Increasing the covering ratio reduces the losses in the IGBT according to the first embodiment. As described in FIG. 3 with the open circles, the on-resistance of the IGBT according to the first embodiment changes in a similar manner when compared to the on-resistance of the conventional IEGT, indicating the IEGT effect realized in the IGBT according to the first embodiment. As FIGS. 3 through 5 indicate, the optimum ratio of the width of p-type base layer 3 between the trenches, when p-type base layer 3 and n+-type source regions 4 are in direct contact with emitter electrode 8, to the width of p-type base layer 3 between the trenches, when p-type base layer 3 is not in direct contact with emitter electrode 8, is from 1:2 to 1:7. That is, the optimum ratio of the width of the first region to the width of the second region of p-type base layer 3 is from 1:2 to 1:7.

The IGBT according to the first embodiment is manufactured in the following way. An epitaxial wafer is prepared by growing a lightly doped n-type drift layer 2 on a heavily doped p-type silicon substrate 1. A lightly doped p-type base layer 3 is formed in the surface portion of the epitaxial wafer and an oxide film is formed on p-type base layer 3 by implanting p-type impurity ions into the surface portion of the epitaxial wafer and by thermally driving the implanted impurity ions. The oxide film is selectively etched to form windows therein by using a patterned photo resist mask. Trenches are dug from the surface of p-type base layer 3 down to n-type drift layer 2 by etching the portions of p-type base layer 3 below the windows of the oxide film. Gate oxide films 5 are formed on the surfaces of the trenches by thermal oxidation. Polycrystalline silicon layers are deposited in the respective trenches. The polycrystalline silicon layers outside the trenches are etched off so that the polycrystalline silicon layers may remain only in the trenches as gate electrodes 6. Heavily doped n+-type source regions 4 are formed selectively in the surface portions of p-type base layer 3 around the trenches through a resist mask. Interlayer insulation films 7 are formed by depositing a phosphate silicate glass film and such an oxide film by the CVD method and by selectively etching the oxide film through a patterned resist mask. An emitter electrode 8 is formed by depositing an aluminum layer and by etching the aluminum layer through a patterned resist mask so that the necessary electrical wiring may be obtained. A passivation film is formed on the laminate formed thus far by depositing a silicon nitride layer (or an amorphous silicon layer) by the CVD method, and by etching the deposited silicon nitride layer (or the silicon nitride layer) through a patterned photo resist mask. Finally, depositing a gold layer or a silver layer on the back surface of p-type silicon substrate 1 forms a collector electrode.

Second Embodiment

Figure 6:
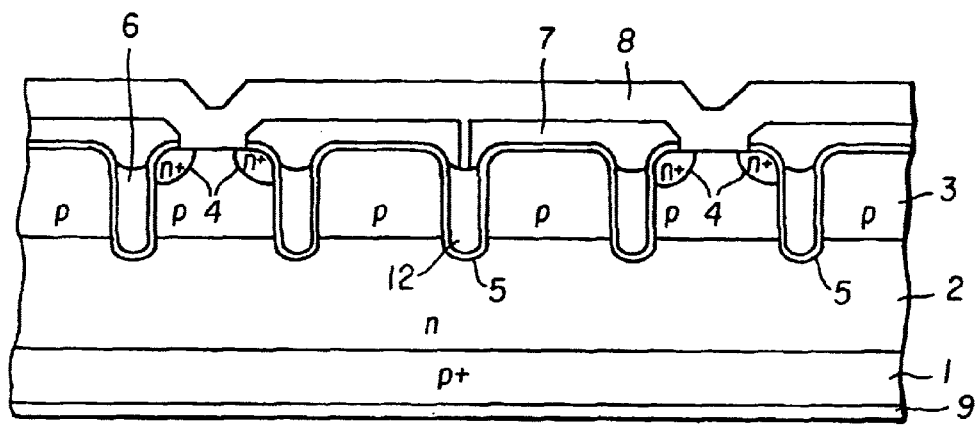
FIG. 6 is a cross sectional view of a trench-type IGBT according to the second embodiment of the invention.

FIG. 6 is a cross sectional view of a trench-type IGBT according to a second embodiment of the invention. FIG. 6 is the cross section perpendicular to the extending direction of the trench gates. Referring now to FIG. 6, the IGBT according to the second embodiment includes polycrystalline silicon layers 12, which do not work as control electrodes. However, polycrystalline silicon layers 12 are connected with emitter electrode 8 via through holes bored through interlayer insulation films 7. Since any capacitance component is caused between polycrystalline silicon layers 12 and emitter electrode 8 due to the interconnection described above, the switching time for turning on or for turning off is shortened.

The IGBT according to the second embodiment is manufactured in essentially the same way as the IGBT according to the first embodiment except that the mask pattern for forming interlayer insulation films 7 is changed so that some polycrystalline silicon layers 12 may be connected to emitter electrode 8, and so that the other polycrystalline silicon layers may not be connected to emitter electrode 8 to form gate electrode 6.

Third Embodiment

Figure 7:
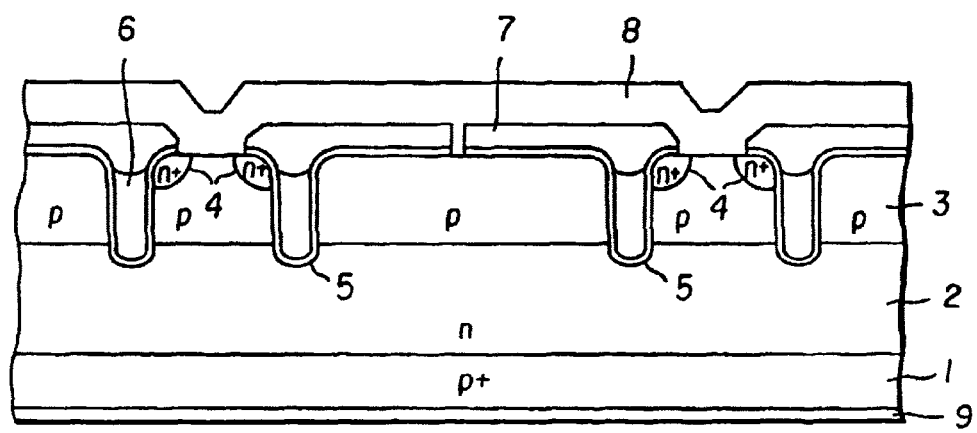
FIG. 7 is a cross sectional view of a trench-type IGBT according to the third embodiment of the invention.
Figure 9:
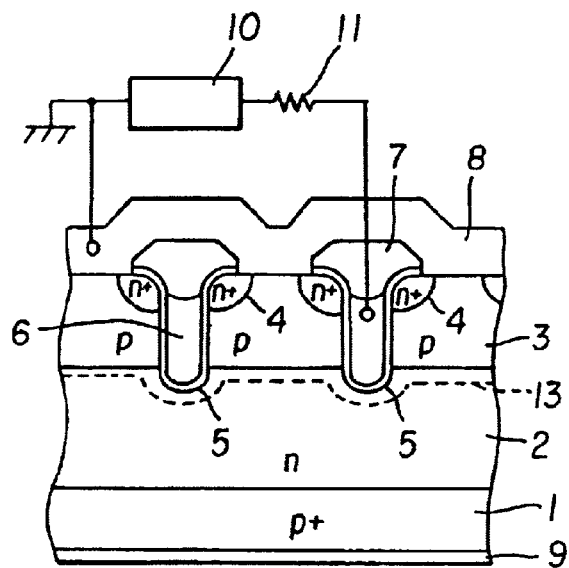
FIG. 9 is a cross sectional view of a conventional trench-type and n-channel IGBT perpendicular to the extending direction of the trench gates thereof.

FIG. 7 is a cross sectional view of a trench-type IGBT according to a third embodiment of the invention. FIG. 7 is the cross section perpendicular to the extending direction of the gates. When a positive voltage higher than the voltage of the emitter electrode is applied to the collector electrode while the voltage applied to the gate electrodes is lower than the threshold value to obtain the so-called blocking voltage characteristics, a depletion layer expands from the bottom of the trenches and p-type base layer 3 into n-type drift layer 2 in the conventional trench-type IGBT as shown in FIG. 9. When trench cells are spaced apart from each other for a narrow spacing as shown in FIG. 9, a depletion layer edge 13 advances from the tips of the trenches as shown by a broken curve in the figure. In the IGBT according to the first embodiment shown in FIG. 1, the depletion layer hardly expands from the second regions of p-type base layer 3 not connected electrically to emitter electrode 8, since the second region is floating electrically and wide. Kinks are caused on the depletion layer edge as shown by a broken curve in FIG. 1, resulting in a low blocking voltage. The IGBT according to the third embodiment obviates the problem described above by connecting the second regions of p-type base layer 3, that is otherwise floating electrically from emitter electrode 8, to emitter electrode 8 via a through hole bored into interlayer insulation film 7. When the through hole is wide, the holes accumulated below the through hole are ejected, impairing the IEGT effect. Therefore, it is important for the through hole to be narrow enough so as not to cause premium electrical contact. Preferably, the through hole is 4 $\mu m^2$ or narrower in area. Since the through hole is disposed solely to stabilize the electrical potential, it is enough to bore a through hole on each of the second regions of p-type base layer 3. Since a depletion layer also expands from the second regions of p-type base layer 3, the potential thereof is equalized to the potential of emitter electrode 8, and the blocking voltage is not lowered.

Fourth Embodiment

Figure 8:
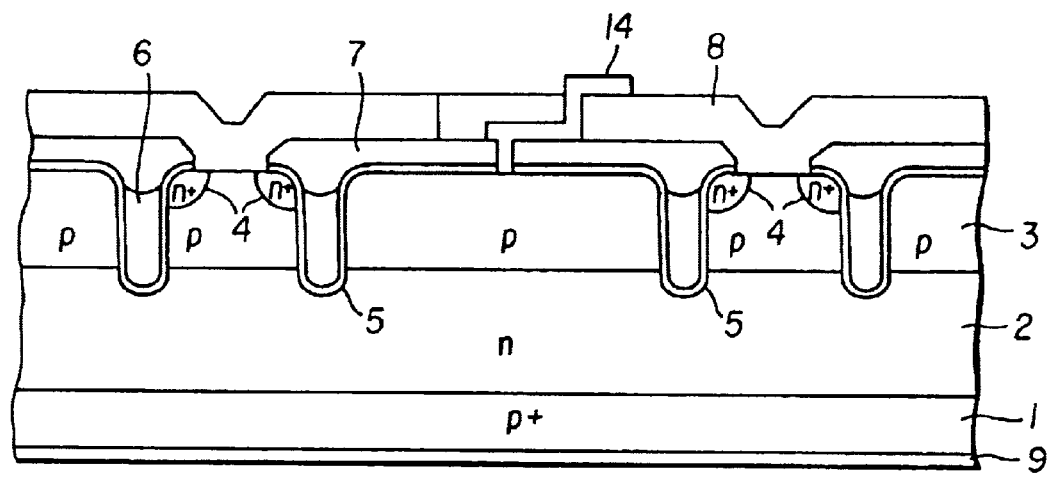
FIG. 8 is a cross sectional view of a trench-type IGBT according to the fourth embodiment of the invention.

FIG. 8 is a cross sectional view of a trench-type IGBT according to a fourth embodiment of the invention. FIG. 8 is the cross section perpendicular to the extending direction of the trench gates. Referring now to FIG. 8, the IGBT according to the fourth embodiment includes a highly resistive film 14, such as a silicon nitride film and an amorphous silicon film, that electrically connects the second region of p-type base layer 3 with emitter electrode 8. The IGBT according to the fourth embodiment exhibits the same effect as those of the IGBT according to the third embodiment.

The IGBT according to the third embodiment or the fourth embodiment is manufactured essentially in the similar way as the IGBT according to the first embodiment except that the second regions of p-type base layer 3 not in direct contact with emitter electrode 8 are connected electrically to emitter electrode 8 via high resistance.

As described above, the insulated gate semiconductor device according to the invention facilitates reducing the total losses by reducing the switching loss while suppressing the on-voltage thereof as low as the on-voltage of the IEGT.

What is claimed is:

1. An insulated gate semiconductor device comprising:

a first semiconductor layer of a first conductivity type having a first major surface and a second major surface;

a lightly doped second semiconductor layer of a second conductivity type on the first major surface of the first semiconductor layer;

a third semiconductor layer of the first conductivity type on the second semiconductor layer, the third semiconductor layer being doped more heavily than the second semiconductor layer, the third semiconductor layer comprising first regions and second regions arranged alternately;

fourth semiconductor layers of the second conductivity type formed selectively in the surface portions of the first regions of the third semiconductor layer;

trenches extending from the surfaces of the fourth semiconductor layers down into the second semiconductor layer through the third semiconductor layer, each of the second regions being formed continuously without any interior trenches;

insulation films covering the inner surfaces of the trenches;

control electrodes in the trenches, the control electrodes facing the third layer through the respective insulation films;

a first main electrode in direct contact with the first regions of the third semiconductor layer and the fourth semiconductor layers;

a second main electrode on the second major surface of the first semiconductor layer; and wherein the ratio of the width of one of the first regions between the trenches of the third semiconductor layer to the width of the second region adjacent to the one first region is from 1:2 to 1:7.

2. The insulated gate semiconductor device according to claim 1, wherein the second regions of the third semiconductor layer are connected electrically to the first main electrode via high resistance.

3. An insulated gate semiconductor device according to claim 1, wherein the second region is formed without any electrodes directly contacting the second region.

4. An insulated gate semiconductor device according to claim 1, wherein the first main electrode is isolated from the second regions of the third semiconductor layer with an insulating layer, the insulating layer having a through hole through which the first main electrode electrically connects with the second regions of the third semiconductor layer.

5. An insulated gate semiconductor device according to claim 1, wherein the first main electrode is not in direct contact with the second regions of the third semiconductor layer.

* * * * *